US012604629B2

(12) United States Patent
Xia et al.

(10) Patent No.: US 12,604,629 B2
(45) Date of Patent: Apr. 14, 2026

(54) DISPLAY PANEL

(71) Applicant: Wuhan China Star Optoelectronics Semiconductor Display Technology Co., Ltd., Hubei (CN)

(72) Inventors: Guoqi Xia, Hubei (CN); Mugyeom Kim, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 699 days.

(21) Appl. No.: 17/781,109

(22) PCT Filed: May 26, 2022

(86) PCT No.: PCT/CN2022/095111
§ 371 (c)(1),
(2) Date: May 31, 2022

(87) PCT Pub. No.: WO2023/206681
PCT Pub. Date: Nov. 2, 2023

(65) Prior Publication Data
US 2024/0188364 A1 Jun. 6, 2024

(30) Foreign Application Priority Data
Apr. 29, 2022 (CN) .......................... 202210474302.7

(51) Int. Cl.
*H10K 59/32* (2023.01)
*H10K 50/13* (2023.01)
*H10K 102/00* (2023.01)

(52) U.S. Cl.
CPC ............. *H10K 59/32* (2023.02); *H10K 50/13* (2023.02); *H10K 2102/351* (2023.02)

(58) Field of Classification Search
None
See application file for complete search history.

(56) References Cited

U.S. PATENT DOCUMENTS

2006/0279204 A1* 12/2006 Forrest ................... H10K 50/11
428/917
2013/0069073 A1* 3/2013 Song ...................... H10K 59/32
257/40

(Continued)

FOREIGN PATENT DOCUMENTS

CN 202503028 10/2012
CN 104021735 9/2014

(Continued)

OTHER PUBLICATIONS

KR-20160043200-A_Machine_Translation (Year: 2016).*

(Continued)

*Primary Examiner* — Erik Kielin

(57) ABSTRACT

The present application discloses a display panel, and a light-emitting functional layer of the display panel. The light-emitting functional layer includes a first light-emitting layer and a second light-emitting layer. The first light-emitting layer includes a first light-emitting sublayer. The second light-emitting layer includes a second light-emitting sublayer. The first light-emitting sublayer has a first film compactness parameter, and the first film compactness parameter is greater than or equal to a first threshold. The second light-emitting sublayer has a second film compactness parameter, and the second film compactness parameter is greater than or equal to a second threshold. The first film compactness parameter and the second film compactness parameter are determined by an amount of change of the film under a unit force condition.

15 Claims, 3 Drawing Sheets

(56) References Cited

U.S. PATENT DOCUMENTS

| | | | |
|---|---|---|---|
| 2016/0248033 A1 | 8/2016 | Uesaka et al. | |
| 2021/0070740 A1 * | 3/2021 | Yoo ................... | H10K 85/6572 |
| 2021/0074932 A1 * | 3/2021 | Park ................... | C07F 15/0086 |

FOREIGN PATENT DOCUMENTS

| | | | | |
|---|---|---|---|---|
| CN | 106410049 | | 2/2017 | |
| CN | 111628095 | | 9/2020 | |
| CN | 114203941 | | 3/2022 | |
| KR | 20160043200 A | * | 4/2016 | |

OTHER PUBLICATIONS

International Search Report and the Written Opinion Dated Nov. 29, 2022 From the International Searching Authority Re. Application No. PCT/CN2022/095111 and Its Translation Into English. (21 Pages).

* cited by examiner

DISPLAY PANEL

RELATED APPLICATIONS

This application is a National Phase of PCT Patent Application No. PCT/CN2022/095111 having International filing date of May 26, 2022, which claims the benefit of priority of Chinese Patent Application No. 202210474302.7 filed on Apr. 29, 2022. The contents of the above applications are all incorporated by reference as if fully set forth herein in their entirety.

FIELD AND BACKGROUND OF THE INVENTION

The present application relates to technical fields of display, in particular, to display panels.

Organic light-emitting diode (OLED) display panels have the characteristics of self-illumination, fast response time, and wide viewing angles, and have a very broad application prospect.

In the current commercial applications, a single-layer OLED device with a single layer of light-emitting units has approached its performance limit. Therefore, scientists connect multiple light-emitting units with the charge generation layer to obtain higher luminous efficiency and longer service life. A device structure of a laminated OLED device is formed by connecting a first light-emitting unit and a second light-emitting unit with a charge generation layer. Due to the existence of the charge generation layer, a charge carrier injected from an electrode can flow through two independent light-emitting units sequentially, such that the luminous efficiency is significantly improved.

However, in the existing structural design strategy of OLED display panels, more consideration is given to the molecular orbital energy level arrangement of each functional layer, but the optimization of the energy level arrangement is more to optimize the efficiency of OLED devices. However, efficiency is not the main reason for limiting the large-scale commercialization of blue phosphorescent OLED devices, it is because the service life of existing blue phosphorescent OLED devices is generally short, as a result, blue phosphorescent OLED light-emitting devices cannot be widely used.

The embodiments of the present application provide a display panel for improving the service life of the display panel.

SUMMARY OF THE INVENTION

The embodiments of the present application provide a display panel, including:

a substrate;

a first electrode provided on the substrate;

a light-emitting functional layer arranged on a side of the first electrode away from the substrate, wherein the light-emitting functional layer comprises a first light-emitting layer, a charge generation layer, and a second light-emitting layer sequentially arranged on the first electrode, the first light-emitting layer comprises a first light-emitting sublayer, and the second light-emitting layer comprises a second light-emitting sublayer; and a second electrode arranged on a side of the second light-emitting layer away from the charge generation layer;

wherein the first light-emitting sublayer has a first film compactness parameter, the first film compactness parameter is greater than or equal to a first threshold, the second light-emitting sublayer has a second film compactness parameter, and the second film compactness parameter is greater than or equal to a second threshold, and the first film compactness parameter and the second film compactness parameter are determined by an amount of change generated by the film under a unit force condition.

Optionally, in some embodiments provided in the present application, the first film compactness parameter and the second film compactness parameter are determined by an amount of thickness change generated by the stressed portion of the film under the unit force condition in the thickness direction of the film.

Optionally, in some embodiments provided in the present application, the first film compactness parameter is calculated by the following formula:

$$X1 = \Delta F1/\Delta H1;$$

wherein $\Delta F1$ is a difference of different forces in the thickness direction of the film; $\Delta H1$ is a thickness difference of the stressed portion of the film under the different forces; and the second film compactness parameter is calculated by the following formula:

$$X2 = \Delta F2/\Delta H2;$$

wherein $\Delta F2$ is a difference of different forces in the thickness direction of the film; $\Delta H2$ is a thickness difference of the stressed portion of the film under the different forces.

Optionally, in some embodiments provided in the present application, the first threshold is −1.7, and the first film compactness parameter is less than 0; and the second threshold is −1.7, and the second film compactness parameter is less than 0.

Optionally, in some embodiments provided in the present application, when the display panel is powered on, a ratio between a dimensional change degree of the light-emitting function layer and an original shape and dimension of the light-emitting function layer is less than or equal to 7.5%.

Optionally, in some embodiments provided in the present application, when the display panel is powered on, a ratio between a thickness expansion degree of the light-emitting functional layer and an original thickness of the light-emitting functional layer is less than or equal to 7.5%.

Optionally, in some embodiments provided in the present application, when the display panel is heated, a ratio between a dimensional change degree of the light-emitting function layer and an original shape and dimension of the light-emitting function layer is less than or equal to 13%.

Optionally, in some embodiments provided in the present application, when the display panel is heated, a ratio between a thickness expansion degree of the light-emitting functional layer and an original thickness of the light-emitting functional layer is less than or equal to 13%.

Optionally, in some embodiments provided in the present application, the charge generation layer comprises a first charge generation layer and a second charge generation layer, the first charge generation layer is arranged on a side of the first light-emitting layer away from the first electrode, the first charge generation layer comprises an n-type charge generation material, the second charge generation layer is arranged on a side of the first charge generation layer away from the first light-emitting layer, and the second charge generation layer comprises a p-type charge generation material.

Optionally, in some embodiments provided in the present application, the first light-emitting layer comprises a first hole injection sublayer, a first hole transport sublayer, the first light-emitting sublayer, a first electron transport sublayer, and a first electron injection sublayer stacked sequentially; and the second light-emitting layer comprises a second hole injection sublayer, a second hole transport sublayer, the second light-emitting sublayer, a second electron transport sublayer, and a second electron injection sublayer stacked sequentially.

Optionally, in some embodiments provided in the present application, energy levels of highest occupied molecular orbitals and lowest unoccupied molecular orbitals of the first hole transport sublayer, the first light-emitting sublayer, and the first electron transport sublayer are decreased sequentially, and energy levels of highest occupied molecular orbitals and lowest unoccupied molecular orbitals of the second hole transport sublayer, the second light-emitting sublayer and the second electron transport sublayer are decreased sequentially.

Optionally, in some embodiments provided in the present application, an energy level difference between the highest occupied molecular orbitals of the first hole transport sublayer and the first light-emitting sublayer is less than or equal to 0.2 eV and an energy level difference between the lowest unoccupied molecular orbital of the first electron transport sublayer and the first light-emitting sublayer is less than or equal to 0.2 eV; and an energy level difference between the highest occupied molecular orbitals of the second hole transport sublayer and the second light-emitting sublayer is less than or equal to 0.2 eV, and an energy level difference between the lowest unoccupied molecular orbitals of the second electron transport sublayer and the second light-emitting sublayer is less than or equal to 0.2 eV. 13. The display panel of claim 1, wherein the first light-emitting sublayer comprises a blue phosphorescent light-emitting material or a blue fluorescent light-emitting material, and the second light-emitting sublayer comprises a blue phosphorescent light-emitting material or a blue fluorescent light-emitting material.

Optionally, in some embodiments provided in the present application, the first light-emitting sublayer and the second light-emitting sublayer comprise a red phosphorescent light-emitting material or a red fluorescent light-emitting material.

Optionally, in some embodiments provided in the present application, the first light-emitting sublayer and the second light-emitting sublayer include a green phosphorescent light-emitting material or a green fluorescent light-emitting material.

Optionally, in some embodiments provided in the present application, the first electrode is an anode and the second electrode is a cathode.

The present application further provides a display panel, including:

a substrate;

a first electrode provided on the substrate;

a light-emitting functional layer arranged on a side of the first electrode away from the substrate, wherein the light-emitting functional layer comprises a first light-emitting layer, a charge generation layer, and a second light-emitting layer sequentially arranged on the first electrode, the first light-emitting layer comprises a first light-emitting sublayer, and the second light-emitting layer comprises a second light-emitting sublayer; and a second electrode arranged on a side of the second light-emitting layer away from the charge generation layer;

wherein the first light-emitting sublayer has a first film compactness parameter, the first film compactness parameter is greater than or equal to a first threshold, the second light-emitting sublayer has a second film compactness parameter, and the second film compactness parameter is greater than or equal to a second threshold, and the first film compactness parameter and the second film compactness parameter are determined by an amount of change generated by the film under a unit force condition, and wherein the film compactnesses are characterized by atomic force microscopy.

Optionally, in some embodiments provided in the present application, the first film compactness parameter and the second film compactness parameter are determined by an amount of thickness change generated by the stressed portion of the film under the unit force condition in the thickness direction of the film.

Optionally, in some embodiments provided in the present application, the first film compactness parameter is calculated by the following formula:

$$X1=\Delta F1/\Delta H1;$$

wherein $\Delta F1$ is a difference of different forces in the thickness direction of the film; $\Delta H1$ is a thickness difference of the stressed portion of the film under the different forces; and the second film compactness parameter is calculated by the following formula:

$$X2=\Delta F2/\Delta H2;$$

wherein $\Delta F2$ is a difference of different forces in the thickness direction of the film; $\Delta H2$ is a thickness difference of the stressed portion of the film under the different forces.

20. The display panel of the current invention, wherein the first threshold is $-1.7$, and the first film compactness parameter is less than 0; and the second threshold is $-1.7$, and the second film compactness parameter is less than 0.

The embodiments of the present application provide a display panel, and the display panel includes a substrate, a first electrode, a light-emitting functional layer, and a second electrode. The first electrode is provided on the substrate. The light-emitting functional layer is arranged on a side of the first electrode away from the substrate. The light-emitting functional layer sequentially includes a first light-emitting layer, a charge generation layer, and a second light-emitting layer provided on the first electrode. The first light-emitting layer includes a first light-emitting sublayer. The second light-emitting layer includes a second light-emitting sublayer. A second electrode is arranged on a side of the second light-emitting layer away from the charge generation layer. The first light-emitting sublayer has a first film compactness parameter, and the first film compactness parameter is greater than or equal to a first threshold. The second light-emitting sublayer has a second film compactness parameter, and the second film compactness parameter is greater than or equal to a second threshold. The first film compactness parameter and the second film compactness parameter are determined by an amount of change of the film under a unit force condition.

The inventor of the present application finds that: when the first film compactness parameter of the first light-emitting sublayer is greater than or equal to the first threshold and the second film compactness parameter of the second light-emitting sublayer is greater than or equal to the second threshold, the film compactness parameters are positively correlated with the service life of the display panel. The greater the film compactness parameter is, the greater the film compactness is, and the longer the service life of the display panel is. In addition, since the display panel with a laminated structure formed by multiple light-emitting units connected in series generates heat during operation, which leads to the expansion of the thickness of the film of the display panel and leads to the change of the length of the microcavity of the display panel. The change in the length of the microcavity leads to the luminous color cast of the device and leads to the display inconformity of the display device. The applicant of the present application finds that: when the first film compactness parameter of the first light-emitting sublayer is greater than or equal to the first threshold and the second film compactness parameter of the second light-emitting sublayer is greater than or equal to the second threshold, the phenomenon of thermoluminescence color cast caused by generating heat of the display panel, which is formed by multiple light-emitting units connected in series, can be effectively improved.

BRIEF DESCRIPTION OF THE SEVERAL VIEWS OF THE DRAWING(S)

In order to more clearly explain the technical solutions according to the embodiments of the present application, the following will briefly introduce the drawings that need to be used in the description of the embodiments. It is apparent that the drawings in the following description are only some embodiments of the present application. For those of skilled in the art can obtain other drawings based on these drawings without any creative work.

DESCRIPTION OF SPECIFIC EMBODIMENTS OF THE INVENTION

Figure 1:
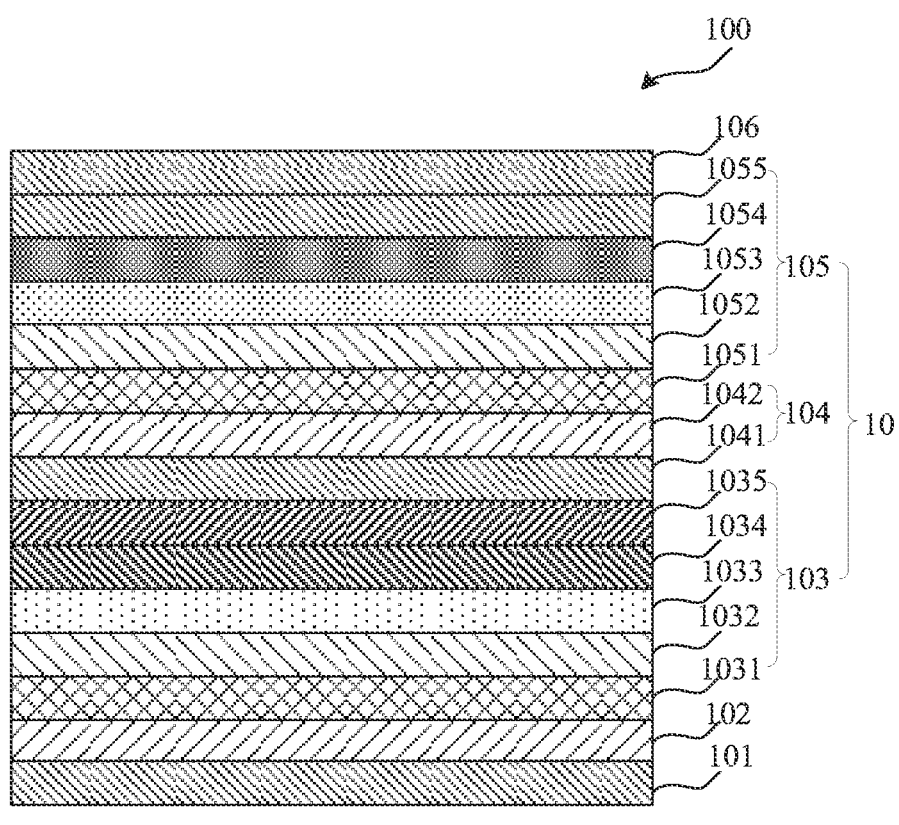
FIG. 1 is a schematic structural view of a display panel provided by an embodiment of the present application.

In order to make the purpose, technical scheme, and advantages of the present application more clear, the present application further describes in detail below accompanying with the drawings. Referring to the illustration in the drawings, in which the same component symbols represent the same components. The following description is illustrated based on the specific embodiments of the present application, which should not be considered as limitations for other specific embodiments not detailed herein. The term "embodiment" is used herein to mean serving as an example, instance, or illustration.

In the description of the present application, it should be understood that, the terms "center", "longitudinal", "lateral", "length", "width", "thickness", "upper", "lower", "front", "rear", "left", "right", "vertical", "horizontal", "top", "bottom", "inner", "outer" "clockwise", and "counterclockwise", etc. indicate an orientation or positional relationship based on the orientation or positional relationship shown in the accompanying drawings and are intended only to facilitate and simplify the description of the present application, not to indicate or imply that the device or element referred to must have a particular orientation, be constructed and operate in a particular orientation, and therefore cannot be construed as a limitation of the present application. In addition, the terms "first" and "second" are only used for descriptive purposes and cannot be understood as indicating or implying relative importance or implicitly indicating the number of indicated technical features. Thus, the features defining "first" and "second" may explicitly or implicitly include one or more of the features. In the description of the present application, the term "a plurality of" in the description of the present application refer to two or more than two, unless otherwise expressly and specifically limited.

The embodiments of the present application provide a display panel. The following contents are detailed descriptions. It should be noted that the order of description of the following embodiments is not a limitation on the preferred order of the embodiments.

The display panel provided by the present application is described in detail through specific embodiments.

Referring to FIG. 1, FIG. 1 is a schematic structural view of a display panel provided by an embodiment of the present application. The display panel 100 includes a substrate 101, a first electrode 102, a light-emitting functional layer 10, and a second electrode 106. The first electrode 102 is provided on the substrate 101. The light-emitting functional layer 10 is arranged on a side of the first electrode 102 away from the substrate 101. The light-emitting functional layer 10 sequentially includes a first light-emitting layer 103, a charge generation layer 104, and a second light-emitting layer 105 provided on the first electrode 102. The first light-emitting layer 103 includes a first light-emitting sublayer 1033. The second light-emitting layer 105 includes a second light-emitting sublayer 1053. The second electrode 106 is provided on a side of the second light-emitting layer 105 away from the charge generation layer 104. The first light-emitting sublayer 1033 has a first film compactness parameter, and the first film compactness parameter is greater than or equal to a first threshold. The second light-emitting sublayer 1053 has a second film compactness parameter, and the second film compactness parameter is greater than or equal to a second threshold. The first film compactness parameter and the second film compactness parameter are determined by an amount of change of the film under a unit force condition.

The inventor of the present application finds that: when the first film compactness parameter of the first light-emitting sublayer 1033 is greater than or equal to the first threshold and the second film compactness parameter of the second light-emitting sublayer 1053 is greater than or equal to the second threshold, the film compactness parameters are positively correlated with the service life of the display panel 100. A greater film compactness parameter, and a greater film compactness may make the service life of the display panel 100 longer. In addition, since the display panel 100 with a laminated structure formed by multiple light-emitting units connected in series generates heat during operation, which leads to the expansion of the thickness of the film of the display panel 100 and leads to the change of the length of the microcavity of the display panel 100. The change in the length of the microcavity leads to the luminous color cast of the device and leads to the display inconformity of the display device. The applicant of the present application finds that: when the first film compactness parameter of the first light-emitting sublayer 1033 is greater than or equal to the first threshold and the second film compactness parameter of the second light-emitting sublayer 1053 is greater than or equal to the second threshold, the phenomenon of thermoluminescence color cast caused by generating heat of the display panel 100, which is formed by multiple light-emitting units connected in series, can be effectively improved.

It should be understood that, in the embodiments of the present application, the first film compactness parameter is related to the film compactness parameter of the first light-emitting sublayer 1033, and a higher film compactness parameter is with a greater first film compactness parameter. The second film compactness parameter is related to the film compactness parameter of the second light-emitting sublayer 1053, and a higher film compactness parameter is with a greater second film compactness parameter.

In the embodiments of the present application, when the first film compactness parameter of the first light-emitting sublayer 1033 is greater than or equal to the first threshold, the greater first film compactness parameter is with higher film compactness of the first light-emitting sublayer 1033. When the second film compactness parameter of the second light-emitting sublayer 1053 is greater than or equal to the second threshold, the greater second film compactness parameter is with higher film compactness of the second light-emitting sublayer 1053, which effectively improves the phenomenon of thermoluminescence color cast caused by generating heat of the display panel 100 which is formed by multiple light-emitting units connected in series, and then improves the phenomenon of display inconformity of the display panel 100.

It should be noted that, in the embodiments of the present application, the unit force includes, but is not limited to, forces applied to the first light-emitting sublayer 1033 and the second light-emitting sublayer 1053. The unit force used here refers to the smallest unit forces for measurement are applied to the first light-emitting sublayer 1033 and the second light-emitting sublayer 1053, such as 1N, 2N, 5N, 10N, etc.

It should be noted that, in the embodiments of the present application, an amount of change generated by the film includes, but is not limited to, an amount of thickness change of the film.

In some embodiments, the first film compactness parameter and the second film compactness parameter are determined by an amount of thickness change generated by the stressed portion of the film under the unit force condition in the thickness direction of the film. Specifically, the first film compactness parameter can be calculated by the following formula: $X1=\Delta F1/\Delta H1$, wherein X1 is the first film compactness parameter, F1 is a difference of different forces in the thickness direction of the film; H1 is a thickness difference of the stressed portion of the film under the different forces, and $0>X1\geq-1.7$ N/cm.

Namely, the first threshold is $-1.7$ N/cm. When the first film compactness parameter is greater than or equal to $-1.7$ and less than 0, the greater the first film compactness parameter is, the higher the film compactness is, and the more uniform display the display panel 100 is.

The second film compactness parameter can be calculated by the following formula: $X2=\Delta F2/\Delta H2$, wherein X2 is the second film compactness parameter, F2 is a difference of different forces in the thickness direction of the film; H2 is a thickness difference of the stressed portion of the film tinder the different forces, and $0>X2\geq-1.7$ N/cm.

Namely, the second threshold is $-1.7$ N/cm. When the second film compactness parameter is greater than or equal to $-1.7$ and less than 0, the greater the second film compactness parameter is, the higher the film compactness is, and the more uniform display the display panel 100 is.

$\Delta F1$ or $\Delta F2$ nay be a difference between two different forces applied to the same stressed portion and $\Delta H1$ or $\Delta H2$ is a difference in thicknesses corresponding to the two different forces applied. Alternatively, $\Delta F1$ or $\Delta F2$ is a difference between the forces applied to two different stressed portions, and $\Delta H1$ or $\Delta H2$ is a difference in the thicknesses corresponding to the two different forces applied.

It should be noted that, in the embodiment of the present application, the greater the unit force of the film is, the smaller the thickness of the corresponding film is.

In the present application, the first film compactness parameter of the first light-emitting sublayer 1033 and the second film compactness parameter of the second light-emitting sublayer 1053 may be characterized by an atomic force microscope. Under the characterization of the atomic force microscope, there is a linear relationship between the thickness of the first light-emitting sublayer 1033 and the force of the probe of the atomic force microscope applied on the first light-emitting sublayer 1033, and the slope of the linear relationship is the second film compactness parameter. There is a linear relationship between the thickness of the second light-emitting sublayer 1053 and the force of the probe of the atomic force microscope applied on the second light-emitting sublayer 1053, and the slope of the linear relationship is the second film compactness parameter.

Specifically, the first light-emitting sublayer 1033 and the second light-emitting sublayer 1053 are characterized by the atomic force microscope, and then the linear relationship between the thickness of the first light-emitting sublayer 1033 and the force of the atomic force microscope probe applied on the first light-emitting sublayer 1033 is established, and the linear relationship between the thickness of the second light-emitting sublayer 1053 and the force of the atomic force microscope probe applied on the second light-emitting sublayer 1053 is established. The greater the slopes of the linear relationships are, the greater the film compactnesses of the first light-emitting sublayer 1033 and the second light-emitting sublayer 1053 are. It is more beneficial to improve the thermotropic color cast phenomenon of the display panel 100.

Figure 2:
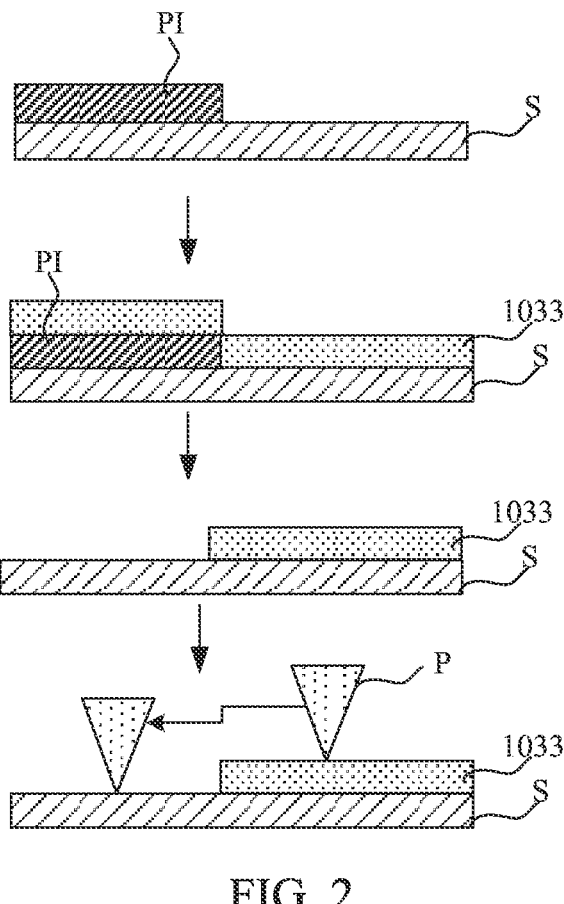
FIG. 2 is a schematic view that characterizes a film compactness parameter of a first light-emitting sublayer by an atomic force microscope in the embodiment.

Referring to FIG. 2, FIG. 2 is a schematic view that characterizes the first film compactness parameter of the first light-emitting sublayer by the atomic force microscope in an embodiment. The evaluation of the film compactness parameters of the first light-emitting sublayer 1033 specifically includes a step of characterizing the light-emitting sublayer 1033 by the atomic force microscope.

The process of characterizing the first light-emitting sublayer 1033 by the atomic force microscope may include a step of providing the first light-emitting sublayer 1033 on a substrate S, and then detecting a relative thickness of the first light-emitting sublayer 1033 with a probe P. The step of providing the first light-emitting sublayer 1033 on the substrate S includes providing a polyimide layer PI on the substrate S. The polyimide layer PI covers a part of the substrate S. After that, the light-emitting sublayer 1033 is evaporated on the substrate S, the first light-emitting sublayer 1033 covers the polyimide layer PI and the substrate S, and then the polyimide layer PI is peeling off, so as to prepare the first light-emitting sublayer 1033 on the substrate S. In the embodiments of the present application, the first light-emitting sublayer 1033 covers only a portion of the substrate S to form a height difference for measuring a relative thickness of the first light-emitting sublayer 1033. The steps of detecting the relative thickness of the first light-emitting sublayer 1033 by using the probe P include: first, randomly selecting any point on the first light-emitting sublayer 1033, and applying the first force to it through the probe P. Then, the first relative thickness of the first light-emitting sublayer 1033 is measured by applying the probe P to the substrate S using the first force. Next, randomly selecting another point on the first light-emitting sublayer 1033, and applying the probe P applies a second force to it, and then applies a second force to it through the probe P. Then, a second relative thickness of the first light-emitting sublayer 1033 is measured by applying the probe P to the substrate S using the second force. In this way, a third relative thickness of the first light-emitting sublayer 1033 is measured by a third force, and a fourth relative thickness of the light-emitting layer is measured by a fourth force. Nth relative thickness of the first light-emitting sublayer 1033 is measured by using Nth force. Finally, taking the forces of sublayer 1033 as the ordinate, the slope of the fitted linear relationship is taken as the first film compactness parameter of the first light-emitting sublayer 1033, in which the slope is −1.69.

It should be understood that the principle of characterizing the second film compactness parameter of the second light-emitting sublayer 1053 by the atomic force microscope is the same as that of the first light-emitting sublayer 1033, which will not be repeated here.

Figure 4:
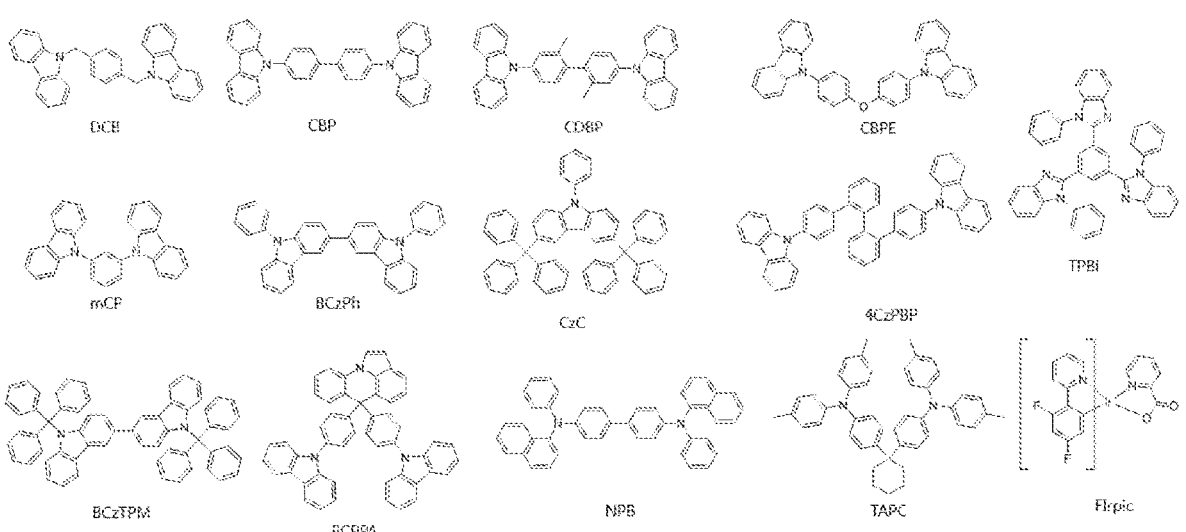
FIG. 4 is a chemical structural formula of the organic light-emitting material provided in the embodiment of the present application.

Specifically, the embodiments of the present application use ten different organic light-emitting materials as the main materials of the first light-emitting sublayer 1033 and the second light-emitting sublayer 1053, so as to evaluate the compactnesses of the formed films and luminescent properties of the first light-emitting sublayer 1033 and the second light-emitting sublayer 1053. Referring to FIG. 4, FIG. 4 is a chemical structural formula of the organic light-emitting material provided in the embodiment of the present application. Organic light-emitting materials include DCB, CBP, CDBP, CBPE, mCP, BCzph, CzC, 4CzPBP, TPBi, BCzTPM, BCPPA, NPB, TAPC, and Firpic.

Referring to table 1, which shows the performance test results of the ten different organic light-emitting materials as the main material of the display panel.

TABLE 1

| Organic light-emitting material | Slope | EL peak | Voltage @J10 | EQE/ % | LT95@100 nit | ΔCIEy | ΔP | ΔFw |
|---|---|---|---|---|---|---|---|---|
| DCB | −2.07 | 471 | 3.62 | 18.7 | 32 | 0.035 | 5 | 7 |
| CBP | −1.95 | 472 | 3.61 | 18.6 | 50 | 0.034 | 5 | 7 |
| CDBP | −1.88 | 472 | 3.62 | 19.1 | 69 | 0.030 | 4 | 6 |
| CBPE | −1.74 | 472 | 3.59 | 19.0 | 88 | 0.024 | 4 | 6 |
| mCP | −1.69 | 471 | 3.60 | 19.2 | 107 | 0.020 | 4 | 5 |
| BCzPh | −1.55 | 473 | 3.59 | 19.3 | 142 | 0.017 | 3 | 5 |
| CzC | −1.43 | 473 | 3.60 | 19.7 | 179 | 0.014 | 3 | 4 |
| 4CzPBP | −1.39 | 471 | 3.59 | 20.1 | 206 | 0.010 | 2 | 4 |
| BCzTPM | −1.26 | 472 | 3.58 | 19.9 | 219 | 0.006 | 1 | 4 |
| BCPPA | −1.17 | 471 | 3.58 | 20.3 | 264 | 0.003 | 0 | 3 | the probe received by the first light-emitting sublayer 1033 as the abscissa and the thicknesses of the first light-emitting sublayer 1033 as the ordinate, the slope of the fitted linear relationship is taken as the first film compactness parameter of the first light-emitting sublayer 1033. The greater the slope is, the greater the film compactness of the first light-emitting sublayer 1033 is, which is more beneficial to the thermotropic color cast phenomenon of the display panel 100.

In the embodiments of the present application, the thickness of the first light-emitting sublayer 1033 decreases with the increase of the force of the probe P applied on the first light-emitting sublayer 1033. The greater the force of the probe P applied on the first light-emitting sublayer 1033 is, the smaller the thickness of the corresponding first light-emitting sublayer 1033 is. In the embodiments of the present application, the forces of the probe P applied on the first light-emitting sublayer 1033 are taken as the abscissa and the thicknesses of the first light-emitting sublayer 1033 are taken as the ordinate to fit the corresponding linear relationship.

Figure 3:
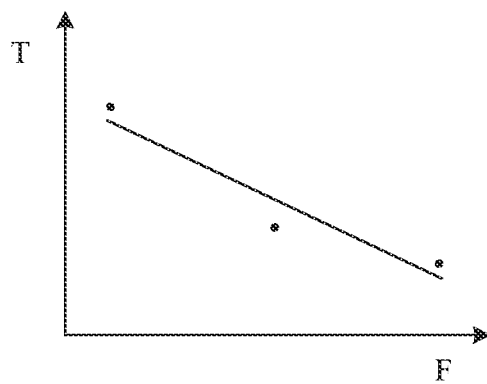
FIG. 3 is a fitting linear relationship that uses mCP as the main material of the first light-emitting sublayer provided in the embodiment of the present application.

Referring to FIG. 3, FIG. 3 is a fitting linear relationship that uses mCP (n, n-dicarbazolyl-3,5-benzene) as the main material of the first light-emitting sublayer provided in the embodiment of the present application. In the embodiments of the present application, taking the forces (F) of the probe received by the first light-emitting sublayer 1033 as the abscissa and the thicknesses (T) of the first light-emitting It can be seen from Table 1 that the voltage decreases slightly, the external quantum efficiency (EQE) increases slightly, and the service life increases significantly with the increase of film compactness. It is proved that it is more beneficial to the performance of laminated blue phosphorescent devices with the higher the film compactness. In addition, the CIEy variations (ΔCIEy), emission peak position variations (ΔP), and half peak width variations (ΔFW) of the device at room temperature and 60° C. are also tested. The results are shown in Table 1. The experimental results show that the higher the film compactness is, the smaller the degree of the thermotropic color cast is.

It should be noted that the slopes are measured by the above atomic force microscope acting on the films of the first light-emitting sublayer 1033 and the second light-emitting sublayer 1053. When the slope is greater than or equal to −1.7, the degree of the thermotropic color cast is smaller, and the service life of the display panel 100 increases significantly. Certainly, the first threshold may be selected from −1.65, −1.6, −1.55, −1.5, −1.45, −1.4, −1.35, −1.3, −1.25, −1.2, −1.15, etc. The second threshold may be selected from −1.65, −1.6, −1.55, −1.5, −1.45, −1.4, −1.35, −1.3, −1.25, −1.2, −1.15, etc.

Compared with the red phosphorescent material and the green phosphorescent material, the service life of the blue phosphorescent material is particularly short, resulting in the reduction of the overall service life and the reliability of the display panel 100. In the embodiments of the present application, taking the blue phosphorescent material as an example, by increasing the film-forming compactness of the blue phosphorescent material, the thermotropic color cast is reduced, and the service life and reliability of the display panel 100 with the blue phosphorescent material are improved, and the market competitiveness is improved.

In some embodiments, the first light-emitting sublayer 1033 includes, but is not limited to, a blue phosphorescent material or a blue fluorescent material. The first light-emitting sublayer 1033 may also be a red phosphorescent material, a green phosphorescent material, a red fluorescent material, or a green fluorescent material. The second light-emitting sublayer 1053 includes, but is not limited to, a blue phosphorescent material or a blue fluorescent material. The second light-emitting sublayer 1053 may also be a red phosphorescent material, a green phosphorescent material, a red fluorescent material, or a green fluorescent material.

In the embodiment of the present application, the first light-emitting sublayer 1033 and the second light-emitting sublayer 1053 are characterized by the atomic force microscope, the linear relationship between the thickness of the first light-emitting sublayer 1033 and the force of the probe of the atomic force microscope received by the first light-emitting sublayer 1033 is established, and the linear relationship between the thickness of the second light-emitting sublayer 1053 and the force of the probe of the atomic force microscope received by the second light-emitting sublayer 1053 is established. The greater the slope of the linear relationship is, the slopes of the linear relationship are the film compactness parameters of the first light-emitting sublayer 1033 and the second light-emitting sublayer 1053, the larger the film compactness parameter is, the greater the compactnesses of the first light-emitting sublayer 1033 and the second light-emitting sublayer 1053 are, the smaller the degree of the thermotropic color cast is, and the longer the service life of the display panel 100 is. In the embodiment of the present application, when the first film compactness parameter is greater than or equal to the first threshold and the second film compactness parameter is greater than or equal to the second threshold, the service life of the display panel 100 is greatly improved.

In some embodiments of the present application, the film-forming qualities of the first light-emitting sublayer 1033 and the second light-emitting sublayer 1053 may also be evaluated by a dimensional deformation degree of the display panel 100.

In order to further evaluate the film-forming qualities of the first light-emitting sublayer 1033 and the second light-emitting sublayer 1053, when the display panel 100 is powered on, a ratio between the degree of the dimensional change of the light-emitting functional layer 10 and the shape and dimension of the original light-emitting functional layer 10 is less than or equal to 7.5%.

It should be noted that the degree of the dimension change of the light-emitting functional layer 10 includes, but is not limited to, the thickness expansion degree of the light-emitting functional layer 10.

In some embodiments, when the display panel 100 is powered on, a ratio between a thickness expansion degree of the light-emitting functional layer 10 and an original thickness of the light-emitting functional layer 10 is less than or equal to 7.5%.

For example, the light-emitting function layer 10 has a first thickness a before being powered on for operation, and the light-emitting function layer 10 has a second thickness b after being lit at a preset brightness for a preset operating time. The thickness expansion degree of the second thickness b and the first thickness a $\omega 1$ is less than or equal to 7.5%, where, $\omega=[(b-a)/a]*100\%$.

In some embodiments, the preset brightness may be 100 nits, and the preset time may be 1 hour. Specifically, after the light-emitting functional layer 10 operates at a brightness of 100 nits for 1 hour, the thicknesses before and after being lit are measured by an interferometer.

In some embodiments, the thicknesses of the light-emitting functional layer 10 before and after heating can also be evaluated by heating the display panel 100.

When the display panel 100 is heated, a ratio between the dimensional deformation degree of the light-emitting functional layer 10 and the original shape and dimension of the light-emitting functional layer 10 is less than or equal to 13%.

In some embodiments, when the display panel 100 is heated, a ratio between a thickness expansion degree of the light-emitting functional layer 10 and an original thickness of the light-emitting functional layer 10 is less than or equal to 13%.

Specifically, the light-emitting functional layer 10 before heating has a first thickness a, and after the light-emitting functional layer 10 is heated at a preset temperature for a preset operation time, the light-emitting functional layer 10 has a second thickness c, the thickness expansion degree of the second thickness c and the first thickness a $\omega 2$ is less than or equal to 13%. where, $\omega 2=[(c-a)/a]*100\%$.

The preset temperature may be 100 degrees Celsius and the preset operation time may be 1 hour. Specifically, the light-emitting functional layer 10 is heated to 100° C., maintained at 100° C. for 1 hour, and the thickness of the heated light emitting functional layer 10 is measured by an interferometer.

Referring to table 2, which shows the thickness expansion degree of the light-emitting functional layer 10 in the power on state and heating state of the display panel 100.

TABLE 2

| Organic light-emitting material | $\omega 1$ | $\omega 2$ |
|---|---|---|
| DCB | 10.1% | 15.1% |
| CBP | 9.4% | 14.5% |
| CDBP | 8.7% | 13.9% |
| CBPE | 8.1% | 13.3% |
| mCP | 7.6% | 12.7% |
| BCzPh | 7.0% | 12.1% |
| CzC | 6.7% | 11.4% |
| 4CzPBP | 5.6% | 10.8% |
| BCzTPM | 5.0% | 10.2% |
| BCPPA | 4.7% | 9.6% |

It can be seen from Table 2 that the thicknesses of the light-emitting functional layer 10 of the display panel 100 before and after heating are measured by an interferometer to obtain the thickness expansion degree of the light-emitting functional layer 10 before and after heating. The smaller the thickness expansion degree is, the better the film-forming qualities of the first light-emitting sublayer 1033 and the second light-emitting sublayer 1053 are. The higher the film compactnesses of the first light-emitting sublayer 1033 and the second light-emitting sublayer 1053 are, the better the performance of the display panel 100 is, and the smaller the thickness expansion degree of the light-emitting functional layer 10 after heating is. It should be noted that, in practical applications, the maximum value of $\omega 1$ may be 7.5%, 7%, 6.5%, 6%, 5.5%, 5%, 4.5%, etc; and the maximum value of $\omega 2$ may be 13%, 12.5%, 12%, 11.5%, 11%, 10.5%, 10%, 9.5%, 9%, etc.

Combined with Table 1 and Table 2 can be seen, that the higher the film compactness parameters of the first light-emitting sublayer and the second light-emitting sublayer are, the higher the film compactness is, and the better the luminous performance is. The smaller the thickness expansion degree of the light-emitting functional layer 10 after heating is, the smaller the thermotropic color cast degree is, the more uniform the display is, and the longer the service life of the display panel 100 is.

In the embodiments of the present application, the film-forming quality of the light-emitting functional layer 10 of the display panel 100 is evaluated from two dimensions. It includes evaluating the densities of the first light-emitting sublayer 1033 and the second light-emitting sublayer 1053, and evaluating the thickness of the light-emitting functional layer 10 of the display panel 100 as a whole, before and after heat exposure. The film-forming quality of the display panel 100 is evaluated from two dimensions. It shows that under the characterization of the atomic force microscope, the greater the slope is, the greater the film compactness parameter of the light-emitting sublayer is, and the greater the density of the light-emitting sublayer is. With the increase of the light-emitting sublayer compactness, there is a small effect on the voltage and Electroluminescence peak (EL Peak), the external quantum efficiency (EQE) is slightly improved, and the lifetime is significantly improved. It is proved that the higher the compactness of the light-emitting sublayer is, the more beneficial to the luminescent properties of blue phosphorescent materials. The thickness of the complete display panel is measured by an interferometer, before and after heat exposure, to obtain the thickness expansion degree before and after heat exposure. The smaller the thickness expansion degree is, the better the film-forming qualities of the first light-emitting sublayer 1033 and the second light-emitting sublayer 1053 are. The higher the compactnesses of the first light-emitting sublayer 1033 and the second light-emitting sublayer 1053 are, the better the luminous performance is, and the smaller the thickness expansion degree of the heated light-emitting functional layer 10 is. The smaller the thermotropic color cast is, the more uniform the display is, and the longer the service life of the display panel 100 is.

Referring to FIG. 1, the charge generation layer 104 includes a first charge generation layer 1041 and a second charge generation layer 1042. The first charge generation layer 1041 is arranged on a side of the first light-emitting layer 103 away from the first electrode 102, and the second charge generation layer 1042 is arranged on a side of the first charge generation layer 1041 away from the first light-emitting layer 103.

The first charge generation layer 1041 is an n-type charge generation layer, and the material of the first charge generation layer 1041 includes an n-type charge generation material. The second charge generation layer 1042 is a p-type charge generation layer, and the material of the second charge generation layer 1042 includes a p-type charge generation material. In the embodiment of the present application, due to the existence of the charge generation layer 104, a charge carrier injected from an electrode can flow through two independent light-emitting units sequentially, such that the luminous efficiency is significantly improved.

The first light-emitting layer 103 further includes a first hole injection sublayer 1031, a first hole transport sublayer 1032, a first electron transport sublayer 1034, and a first electron injection sublayer 1035. The first hole injection sublayer 1031 and the first hole transport sublayer 1032 are sequentially arranged on the first electrode 102. The first light-emitting sublayer 1033 is arranged on the first hole transport sublayer 1032. The first electron transport sublayer 1034 and the first electron injection sublayer 1035 are sequentially arranged on the first light-emitting sublayer 1033. The first charge generation layer 1041 and the second charge generation layer 1042 are sequentially arranged on the first electron injection sublayer 1035. The second light-emitting layer 105 further includes a second hole injection sublayer 1051, a second hole transport sublayer 1052, a second electron transport sublayer 1054, and a second electron injection sublayer 1055. The second hole injection sublayer 1051 and the second hole transport sublayer 1052 are sequentially arranged on the second charge generation layer 1042. The second electron transport sublayer 1054 and the second electron injection sublayer 1055 are sequentially arranged on a side of the second light-emitting sublayer 1053 away from the second hole transport sublayer 1052.

Figure 5:
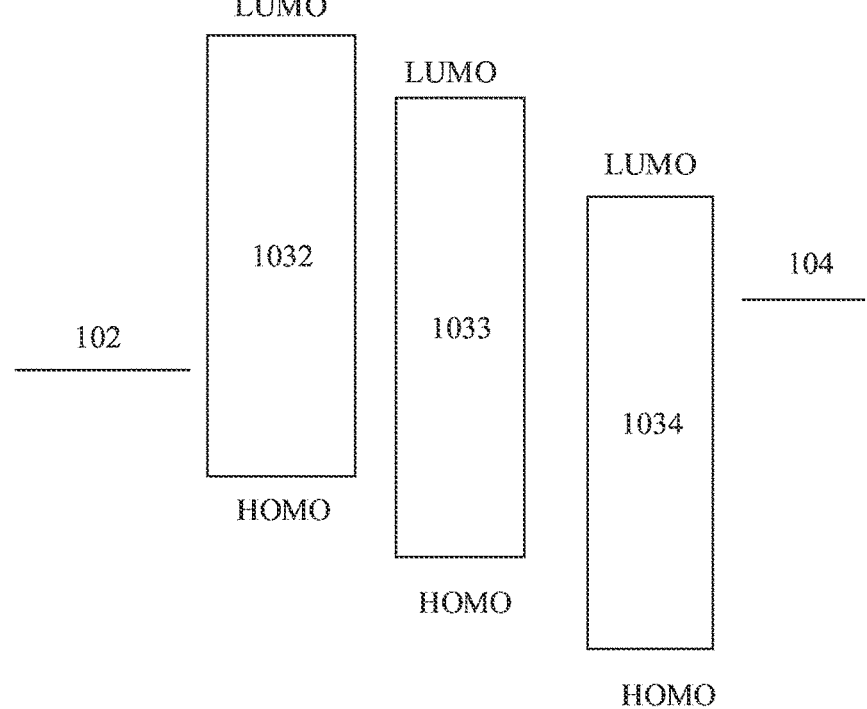
FIG. 5 is an energy level arrangement diagram of the display panel provided in the embodiment of the present application.

Referring to FIG. 5, FIG. 5 is an energy level arrangement diagram of the display panel provided in the embodiment of the present application. In some embodiments, energy levels of the lowest unoccupied molecular orbitals and highest occupied molecular orbitals of the first hole transport sublayer 1032, the first light-emitting sublayer 1033, and the first electron transport sublayer 1034 are decreased sequentially.

In the embodiments of the present application, since the energy levels of the lowest unoccupied molecular orbitals and the highest occupied molecular orbitals of the first hole transport sublayer 1032, the first light-emitting sublayer 1033 and the first electron transport sublayer 1034 are decreased sequentially, i.e., the energy levels of the highest occupied molecular orbitals and the lowest unoccupied molecular orbitals of each adjacent organic film material are arranged in a step form, This kind of arrangement facilitates to the balance injection and transport of charge carriers and reduce the energy level barrier, so as to improve the luminous efficiency of the display panel 100 and obtain the optimal device performance.

It should be noted that the highest occupied molecular orbitals refer to the molecular orbital with the highest energy among the molecular orbitals occupied by electrons, the molecular orbital with the highest energy is called the highest occupied molecular orbital, also known as HOMO. Among the molecular orbitals unoccupied by electrons, the molecular orbital with the lowest energy is called the lowest unoccupied molecular orbital.

In some embodiments, electrons and holes can be injected in a balanced ratio of 1:1, to realize the efficient utilization of electrons and holes.

In order to reduce the potential energy barrier for the injection of holes from the first electrode 102, holes can be effectively injected into the display panel 100 from the first electrode 102. The transmission rate of holes is generally greater than that of electrons. In order to make the recombination of electrons and holes injected from the electrode occur in the first light-emitting sublayer 1033, the energy level structures of the first hole transport sublayer 1032 and the first light-emitting sublayer 1033 are matched, and it matches the hole migration rate. In order to reduce the potential energy barrier for the injection of electrons from the second electrode 106, electrons can be effectively injected into the display panel 100 from the second electrode 106. Therefore, the material of the first electron injection sublayer 1035 is selected in order to effectively inject electrons from the second electrode 106 into the display panel 100. Reduction of the potential energy barrier for injecting holes from the anode can make holes be effectively injected into OLED devices from the anode. Therefore, when the material of the electron injection layer is selected, it is necessary to consider the energy level of the material and the match with the material of the second electrode 106.

In some embodiments, the energy levels of the lowest unoccupied molecular orbitals and the highest occupied molecular orbital of the first hole injection sublayer 1031, the first hole transport sublayer 1032, the first light-emitting sublayer 1033, the first electron transport sublayer 1034, and the first electron injection sublayer 1035 are sequentially decreased. This arrangement facilitates to the balance of injection and transport of charge carriers and reduces the energy level barrier, so as to further improve the luminous efficiency of the display panel 100 and obtain the optimal device performance.

In some embodiments, an energy level difference between the highest occupied molecular orbitals of the first hole transport sublayer 1032 and the first light-emitting sublayer 1033 is less than or equal to 0.2 eV, and an energy level difference between the lowest unoccupied molecular orbitals of the first electron transport sublayer 1034 and the first light-emitting sublayer 1033 is less than or equal to 0.2 eV. Thus, the potential energy barrier between adjacent organic film layers is reduced and the luminous efficiency of the display panel 100 is further improved.

Specifically, an energy level difference between the highest occupied molecular orbitals of the first hole transport sublayer 1032 and the first light-emitting sublayer 1033 may be any one of 0.05 eV, 0.08 eV, 0.12 eV, 0.15 eV, 0.18 eV or 0.2 eV. An energy level difference between the lowest unoccupied molecular orbitals of the first hole transport sublayer 1032 and the first light-emitting sublayer 1033 may be any one of 0.05 eV, 0.08 eV, 0.12 eV, 0.15 eV, 0.18 eV or 0.2 eV. Thus, the potential energy barrier between adjacent organic film layers is reduced and the luminous efficiency of the display panel 100 is further improved.

In some embodiments, energy levels of the lowest unoccupied molecular orbitals and highest occupied molecular orbitals of the second hole transport sublayer 1052, the second light-emitting sublayer 1053, and the second electron transport sublayer 1054 are decreased sequentially.

In the embodiments of the present application, since the energy levels of the lowest unoccupied molecular orbitals and the highest occupied molecular orbitals of the second hole transport sublayer 1052, the second light-emitting sublayer 1053 and the second electron transport sublayer 1054 are decreased sequentially, i.e., the energy levels of the highest occupied molecular orbitals and the lowest unoccupied molecular orbitals of each adjacent organic film material are arranged in a step form, This kind of arrangement facilitates to the balance injection and transport of charge carriers and reduce the energy level barrier, so as to improve the luminous efficiency of the display panel 100 and obtain the optimal device performance.

In some embodiments, electrons and holes can be injected in a balanced ratio of 1:1, to realize the efficient utilization of electrons and holes.

In order to reduce the potential energy barrier for the injection of holes from the first electrode 102, holes can be effectively injected into the display panel 100 from the first electrode 102. The transmission rate of holes is generally greater than that of electrons. In order to make the recombination of electrons and holes injected from the electrode occur in the first light-emitting sublayer 1033, the energy level structures of the second hole transport sublayer 1052 and the second light-emitting sublayer 1053 are matched, and it matches the hole migration rate. In order to reduce the potential energy barrier for the injection of electrons from the second electrode 106, electrons can be effectively injected into the display panel 100 from the second electrode 106. Therefore, the material of the second electron injection sublayer 1055 is selected in order to effectively inject electrons from the second electrode 106 into the display panel 100. Reduction of the potential energy barrier for injecting holes from the anode can make holes be effectively injected into OLED devices from the anode. Therefore, when the material of the electron injection layer is selected, it is necessary to consider the energy level of the material and the match with the material of the second electrode 106.

In some embodiments, the energy levels of the lowest unoccupied molecular orbitals and the highest occupied molecular orbital of the second hole injection sublayer 1051, the second hole transport sublayer 1052, the second light-emitting sublayer 1053, the second electron transport sublayer 1054, and the second electron injection sublayer 1055 are sequentially decreased. This arrangement facilitates the balance of injection and transport of charge carriers and reduces the energy level barrier, so as to further improve the luminous efficiency of the display panel 100 and obtain the optimal device performance.

In some embodiments, an energy level difference between the highest occupied molecular orbitals of the second hole transport sublayer 1052 and the second light-emitting sublayer 1053 is less than or equal to 0.2 eV, and an energy level difference between the lowest unoccupied molecular orbitals of the second electron transport sublayer 1054 and the second light-emitting sublayer 1053 is less than or equal to 0.2 eV Thus, the potential energy barrier between adjacent organic film layers is reduced and the luminous efficiency of the display panel 100 is further improved.

Specifically, an energy level difference between the highest occupied molecular orbitals of the second hole transport sublayer 1052 and the second light-emitting sublayer 1053 may be any one of 0.05 eV, 0.08 eV, 0.12 eV, 0.15 eV, 0.18 eV or 0.2 eV. An energy level difference between the lowest unoccupied molecular orbitals of the second hole transport sublayer 1052 and the second light-emitting sublayer 1053 may be any one of 0.05 eV, 0.08 eV, 0.12 eV, 0.15 eV, 0.18 eV or 0.2 eV. Thus, the potential energy barrier between adjacent organic film layers is reduced and the luminous efficiency of the display panel 100 is further improved.

In some embodiments, the display panel 100 further includes a thin film transistor structure layer, which is provided on the substrate 101, and the thin film transistor structure layer is used to drive the display panel 100 to emit light.

In some embodiments, the first electrode 102 is an anode, and the material of the first electrode 102 may be a laminated material of indium tin oxide, silver, and indium tin oxide. The second electrode 106 is a cathode, and the material of the second electrode 106 may be magnesium and silver alloy material.

Accordingly, the embodiments of the present application also provide a manufacturing method for a display panel. The manufacturing method of the display panel 100 includes the following steps:

Step B001: providing a substrate.

Step B002: forming a first electrode on the substrate, wherein the first electrode is a laminated material of indium tin oxide, silver, and indium tin oxide.

Step B003: forming a first light-emitting layer on the first electrode. The first light-emitting layer includes a first hole injection sublayer, a first hole transport sublayer, the first light-emitting sublayer, a first electron transport sublayer, and a first electron injection sublayer stacked sequentially. The material of the first hole transport sublayer may be NPB (N, N'-Di(1-naphthyl)-N,N'-diphenyl-(1,1'-biphenyl)-4,4'-diamine), with a thickness of 10 nm to 60 nm. In a specific embodiment, the thickness of the first hole transport sublayer may be 20 nm. The first light-emitting sublayer is an organic light-emitting material, and the concentration of the doped organic light-emitting material is less than 2%. The evaporation rate of the light-emitting sublayer is less than or equal to 1.5 angstrom/s. In an embodiment, the evaporation rate of the first light-emitting sublayer is 1.0 angstrom/s. The main material of the organic light-emitting materials include DCB, CBP, CDBP, CBE, mCP, BCzph, CzC, 4CzPBP, TPIBi, BCzTPM, BCPPA, NPB, TAPC, and Irpic. The thickness of the first light-emitting sublayer may be ranged from 10 nm to 30 nm. In a specific embodiment, the thickness of the first light-emitting sublayer may be 20 nm.

In some embodiments, the step of forming the first light-emitting layer on the first electrode includes a step of: forming a first electron barrier layer on the first hole transport sublayer, and the material of the first electron barrier layer may be TAPC (4,4'-Cyclohexylidenebis[N,N-bis(4-methylphenyl)aniline]). The thickness of the first electron barrier layer may be ranged from 2 nm to 10 nm. In a specific embodiment, the thickness of the first electron barrier layer may be 5 nm.

Step B004: forming a charge generation layer on the first light-emitting layer, wherein the charge generation layer includes a first charge generation layer and a second charge generation layer. The first charge generation layer is an n-type charge generation layer, and the second charge generation layer is a p-type charge generation layer.

In some embodiments, the first charge generation layer includes an n-type charge generation material, such as TPBi doped with 5% Yb, with a thickness of 100 nm, and the second charge generation layer includes a p-type charge generation material, such as NPB doped 5% with HATCN (2,3,6,7,10,11-hexacyano-1,4,5,8,9,12-hexaazabenzo-phenanthrene), with a thickness of 100 nm.

Step B004: forming a second light-emitting layer on the charge generation layer, wherein the second light-emitting layer includes a second hole injection sublayer, a second hole transport sublayer, a second light-emitting sublayer, a second electron transport sublayer, and a second electron injection sublayer stacked sequentially. The material of the second hole transport sublayer may be NPB (N,N'-Di(1-naphthyl)-N,N'-diphenyl-(1,1'-biphenyl)-4,4'-diamine), and its thickness is ranged from 10 nm to 60 nm. In a specific embodiment, the thickness of the second hole transport sublayer may be 20 nm. The second light-emitting sublayer is an organic light-emitting material, and the concentration of the doped organic light-emitting material is less than 2%. The evaporation rate of the light-emitting sublayer is less than or equal to 1.5 angstrom/s. In one embodiment, the evaporation rate of the second light-emitting sublayer is 1.0 angstrom/s. The main material of the organic light-emitting materials include DCB, CBP, CDBP, CBPE, mCP, BCzph, CzC, 4CzPBP, TPBi, BCzTPM, BCPPA, NPB, TAPC, and Firpic. The thickness of the second light-emitting sublayer may be between 10 nm and 30 nm. In a specific embodiment, the thickness of the second light-emitting sublayer may be 20 nm.

In some embodiments, the second hole transport sublayer is NPB, with a thickness of 20 nm. The material of the second electron transport sublayer is TPBi, and its thickness is 35 nm. The material of the second electron injection sublayer may be Yb (ytterbium), with a thickness of 1 nm.

In some embodiments, the step of forming the second light-emitting layer on the charge generation layer includes a step of: forming a second electron barrier layer on the second hole transport sublayer, and the material of the second electron barrier layer may be TAPC (4,4'-Cyclohexylidenebis[N,N-bis(4-methylphenyl)aniline]). The thickness of the second electron barrier layer may be ranged from 2 nm to 10 nm. In a specific embodiment, the thickness of the second electron barrier layer may be 5 nm.

Step B005: evaporating a second electrode on a side of the second light-emitting layer away from the charge generation layer. The material of the second electrode may include silver and magnesium. The evaporation rate of the second electrode is less than or equal to 3 angstroms/s. In one embodiment, the evaporation rate of the second electrode may be 2 angstroms/s. The thickness of the second electrode ranges from 10 nm to 50 nm. For example, the thickness of the second electrode may be 13.2 nm.

In some embodiments, the Mg doping concentration of the second electrode is 9%.

In view of the above, although the present application has been disclosed as above by preferred embodiments, the above-preferred embodiments are not intended to limit the scope of the present application. A person of ordinary skill in the art can make various modifications and refinements without departing from the spirit and scope of the present application. Therefore, the protections cope of the present application shall be subject to the scope defined in the claims.

What is claimed is:

1. A display panel, comprising:
   a substrate;
   a first electrode provided on the substrate; and
   a light-emitting functional layer arranged on a side of the first electrode away from the substrate, wherein the light-emitting functional layer comprises a first light-emitting layer, a charge generation layer, and a second light-emitting layer sequentially arranged on the first electrode, the first light-emitting layer comprises a first light-emitting sublayer, and the second light-emitting layer comprises a second light-emitting sublayer; and
   a second electrode arranged on a side of the second light-emitting layer away from the charge generation layer;
   wherein the first light-emitting sublayer has a first film compactness parameter, the first film compactness parameter is greater than or equal to a first threshold, the second light-emitting sublayer has a second film compactness parameter, and the second film compactness parameter is greater than or equal to a second threshold, and the first film compactness parameter and the second film compactness parameter are determined by an amount of change generated by the film under a unit force condition;
   wherein the first film compactness parameter is calculated by the following formula:

$$X1 = \Delta F1/\Delta H1;$$

wherein $\Delta F1$ is a difference of different forces in a thickness direction of a film; $\Delta H1$ is a thickness difference of a stressed portion of the film under the different forces; and the second film compactness parameter is calculated by the following formula:

$$X2 = \Delta F2 / \Delta H2;$$

wherein $\Delta F2$ is a difference of different forces in a thickness direction of a film; $\Delta H2$ is a thickness difference of a stressed portion of the film under the different forces;

wherein the first threshold is −1.7, and the first film compactness parameter is less than 0; and the second threshold is −1.7, and the second film compactness parameter is less than 0;

wherein the first light-emitting layer comprises a first hole injection sublayer, a first hole transport sublayer, the first light-emitting sublayer, a first electron transport sublayer, and a first electron injection sublayer stacked sequentially; and the second light-emitting layer comprises a second hole injection sublayer, a second hole transport sublayer, the second light-emitting sublayer, a second electron transport sublayer, and a second electron injection sublayer stacked sequentially;

wherein the charge generation layer comprises a first charge generation layer and a second charge generation layer, the first charge generation layer is arranged on a side of the first light-emitting layer away from the first electrode, the first charge generation layer comprises an n-type charge generation material, the second charge generation layer is arranged on a side of the first charge generation layer away from the first light-emitting layer, and the second charge generation layer comprises a p-type charge generation material;

wherein the n-type charge generation material comprises TPBi doped with 5% Yb, and a thickness of the first charge generation layer is 100 nm; the p-type charge generation material comprises NPB doped with 5% HATCN, and a thickness of the second charge generation layer is 100 nm;

wherein the first light-emitting sublayer is doped with an organic light-emitting material with a dosage concentration being less than 2%, and a thickness of the first light-emitting sublayer ranges from 10 nm to 30 nm; the second light-emitting sublayer is doped with an organic light-emitting material with a dosage concentration being less than 2%, and a thickness of the second light-emitting sublayer ranges from 10 nm to 30 nm; and wherein the second electrode is doped with Mg with a dosage concentration being 9%, and a thickness of the second electrode ranges from 10 nm to 50 nm.

2. The display panel of claim 1, wherein the first film compactness parameter and the second film compactness parameter are determined by the thickness shape variable generated by the stressed portion of the film under the unit force condition in the thickness direction of the film.

3. The display panel of claim 1, wherein, when the display panel is powered on, a ratio between a dimensional deformation degree of the light-emitting function layer and an original shape and dimension of the light-emitting function layer is less than or equal to 7.5%.

4. The display panel of claim 3, wherein, when the display panel is powered on, a ratio between a thickness expansion degree of the light-emitting functional layer and an original thickness of the light-emitting functional layer is less than or equal to 7.5%.

5. The display panel of claim 1, wherein, when the display panel is heated, a ratio between a dimensional deformation degree of the light-emitting function layer and an original shape and dimension of the light-emitting function layer is less than or equal to 13%.

6. The display panel of claim 5, wherein, when the display panel is heated, a ratio between a thickness expansion degree of the light-emitting functional layer and an original thickness of the light-emitting functional layer is less than or equal to 13%.

7. The display panel of claim 1, wherein energy levels of highest occupied molecular orbitals and lowest unoccupied molecular orbitals of the first hole transport sublayer, the first light-emitting sublayer, and the first electron transport sublayer are decreased sequentially, and energy levels of highest occupied molecular orbitals and lowest unoccupied molecular orbitals of the second hole transport sublayer, the second light-emitting sublayer and the second electron transport sublayer are decreased sequentially.

8. The display panel of claim 7, wherein an energy level difference between the highest occupied molecular orbitals of the first hole transport sublayer and the first light-emitting sublayer is less than or equal to 0.2 eV, and an energy level difference between the lowest unoccupied molecular orbital of the first electron transport sublayer and the first light-emitting sublayer is less than or equal to 0.2 eV; and an energy level difference between the highest occupied molecular orbitals of the second hole transport sublayer and the second light-emitting sublayer is less than or equal to 0.2 eV, and an energy level difference between the lowest unoccupied molecular orbitals of the second electron transport sublayer and the second light-emitting sublayer is less than or equal to 0.2 eV.

9. The display panel of claim 1, wherein the first light-emitting sublayer comprises a blue phosphorescent light-emitting material or a blue fluorescent light-emitting material, and the second light-emitting sublayer comprises a blue phosphorescent light-emitting material or a blue fluorescent light-emitting material.

10. The display panel of claim 1, wherein the first light-emitting sublayer and the second light-emitting sublayer comprise a red phosphorescent light-emitting material or a red fluorescent light-emitting material.

11. The display panel of claim 1, wherein the first light-emitting sublayer and the second light-emitting sublayer comprise a green phosphorescent light-emitting material or a green fluorescent light-emitting material.

12. The display panel of claim 1, wherein the first electrode is an anode and the second electrode is a cathode.

13. A display panel comprising:

a substrate;

a first electrode provided on the substrate;

a light-emitting functional layer arranged on a side of the first electrode away from the substrate, wherein the light-emitting functional layer comprises a first light-emitting layer, a charge generation layer, and a second light-emitting layer sequentially arranged on the first electrode, the first light-emitting layer comprises a first light-emitting sublayer, and the second light-emitting layer comprises a second light-emitting sublayer; and a second electrode arranged on a side of the second light-emitting layer away from the charge generation layer;

wherein the first light-emitting sublayer has a first film compactness parameter, the first film compactness parameter is greater than or equal to a first threshold, the second light-emitting sublayer has a second film compactness parameter, and the second film compactness parameter is greater than or equal to a second threshold, and the first film compactness parameter and the second film compactness parameter are determined by an amount of change generated by the film under a unit force condition, and wherein the first film compactness parameter and the second film compactness parameter are characterized by atomic force microscopy;

wherein the first film compactness parameter is calculated by the following formula:

$$X1 = \Delta F1/\Delta H1;$$

wherein $\Delta F1$ is a difference of different forces in a thickness direction of a film;

$\Delta H1$ is a thickness difference of a stressed portion of the film under the different forces; and the second film compactness parameter is calculated by the following formula:

$$X2 = \Delta F2/\Delta H2;$$

wherein $\Delta F2$ is a difference of different forces in a thickness direction of a film; $\Delta H2$ is a thickness difference of a stressed portion of the film under the different forces;

wherein the first threshold is −1.7, and the first film compactness parameter is less than 0; and the second threshold is −1.7, and the second film compactness parameter is less than 0;

wherein the first light-emitting layer comprises a first hole injection sublayer, a first hole transport sublayer, the first light-emitting sublayer, a first electron transport sublayer, and a first electron injection sublayer stacked sequentially; and the second light-emitting layer comprises a second hole injection sublayer, a second hole transport sublayer, the second light-emitting sublayer, a second electron transport sublayer, and a second electron injection sublayer stacked sequentially; and wherein the first light-emitting sublayer is doped with an organic light-emitting material with a dosage concentration being less than 2%, and a thickness of the first light-emitting sublayer ranges from 10 nm to 30 nm; the second light-emitting sublayer is doped with an organic light-emitting material with a dosage concentration being less than 2%, and a thickness of the second light-emitting sublayer ranges from 10 nm to 30 nm.

14. The display panel of claim 13, wherein the first film compactness parameter and the second film compactness parameter are determined by the thickness shape variable generated by the stressed portion of the film under the unit force condition in the thickness direction of the film.

15. A display panel, comprising:

a substrate;

a first electrode provided on the substrate; and a light-emitting functional layer arranged on a side of the first electrode away from the substrate, wherein the light-emitting functional layer comprises a first light-emitting layer, a charge generation layer, and a second light-emitting layer sequentially arranged on the first electrode, the first light-emitting layer comprises a first light-emitting sublayer, and the second light-emitting layer comprises a second light-emitting sublayer; and a second electrode arranged on a side of the second light-emitting layer away from the charge generation layer;

wherein the first light-emitting layer comprises a first hole injection sublayer, a first hole transport sublayer, the first light-emitting sublayer, a first electron transport sublayer, and a first electron injection sublayer stacked sequentially; and the second light-emitting layer comprises a second hole injection sublayer, a second hole transport sublayer, the second light-emitting sublayer, a second electron transport sublayer, and a second electron injection sublayer stacked sequentially;

wherein the charge generation layer comprises a first charge generation layer and a second charge generation layer, the first charge generation layer is arranged on a side of the first light-emitting layer away from the first electrode, the first charge generation layer comprises an n-type charge generation material, the second charge generation layer is arranged on a side of the first charge generation layer away from the first light-emitting layer, and the second charge generation layer comprises a p-type charge generation material;

wherein the n-type charge generation material comprises TPBi doped with 5% Yb, and a thickness of the first charge generation layer is 100 nm; the p-type charge generation material comprises NPB doped with 5% HATCN, and a thickness of the second charge generation layer is 100 nm;

wherein the first light-emitting sublayer is doped with an organic light-emitting material with a dosage concentration being less than 2%, and a thickness of the first light-emitting sublayer ranges from 10 nm to 30 nm; the second light-emitting sublayer is doped with an organic light-emitting material with a dosage concentration being less than 2%, and a thickness of the second light-emitting sublayer ranges from 10 nm to 30 nm; and wherein the second electrode is doped with Mg with a dosage concentration being 9%, and a thickness of the second electrode ranges from 10 nm to 50 nm.

* * * * *